(12) United States Patent
Schroeck et al.

(10) Patent No.: US 11,060,202 B2
(45) Date of Patent: Jul. 13, 2021

(54) METHOD FOR PULLING A SINGLE CRYSTAL COMPOSED OF SEMICONDUCTOR MATERIAL FROM A MELT CONTAINED IN A CRUCIBLE

(71) Applicant: SILTRONIC AG, Munich (DE)

(72) Inventors: Thomas Schroeck, Kastl (DE); Walter Heuwieser, Stammham (DE)

(73) Assignee: SILTRONIC AG, Munich (DE)

( * ) Notice: Subject to any disclaimer, the term of this patent is extended or adjusted under 35 U.S.C. 154(b) by 152 days.

(21) Appl. No.: 16/322,729

(22) PCT Filed: Sep. 28, 2017

(86) PCT No.: PCT/EP2017/074603
§ 371 (c)(1),
(2) Date: Feb. 1, 2019

(87) PCT Pub. No.: WO2018/069051
PCT Pub. Date: Apr. 19, 2018

(65) Prior Publication Data
US 2019/0345630 A1 Nov. 14, 2019

(30) Foreign Application Priority Data

Oct. 10, 2016 (DE) ...................... 10 2016 219 605.7

(51) Int. Cl.
*C30B 15/20* (2006.01)
*C30B 15/14* (2006.01)
*C30B 15/26* (2006.01)

(52) U.S. Cl.
CPC ............ *C30B 15/203* (2013.01); *C30B 15/14* (2013.01); *C30B 15/20* (2013.01); *C30B 15/26* (2013.01)

(58) Field of Classification Search
CPC ....... C30B 15/14; C30B 15/20; C30B 15/203; C30B 15/26
See application file for complete search history.

(56) References Cited

U.S. PATENT DOCUMENTS 5,885,344 A    3/1999   Kim et al.
5,968,263 A * 10/1999   Grover .................... C30B 15/14
                                                                                                        117/14

(Continued)

FOREIGN PATENT DOCUMENTS

CN        1178844 A    4/1998
CN        1267343 A    9/2000

(Continued)

*Primary Examiner* — Hua Qi
(74) *Attorney, Agent, or Firm* — Brooks Kushman P.C.

(57) ABSTRACT

Single crystal semiconductor ingots are pulled from a melt contained in a crucible by a method of controlling the pulling the single crystal in a phase in which an initial cone of the single crystal is grown until a phase in which the pulling of a cylindrical section of the single crystal is begun, by measuring the diameter Dcr of the initial cone of the single crystal and calculating the change in the diameter dDcr/dt; pulling the initial cone of the single crystal from the melt at a pulling rate vp(t) from a point in time t1 until a point in time t2, starting from which the pulling of the cylindrical section of the single crystal in conjunction with a target diameter Dcrs is begun, wherein the profile of the pulling rate vp(t) from the point in time t1 until the point in time t2 during the pulling of the initial cone is predetermined by means of an iterative computation process.

2 Claims, 3 Drawing Sheets

(56) References Cited

U.S. PATENT DOCUMENTS

| | | |
|---|---|---|
| 6,203,611 B1 | 3/2001 | Kimbel et al. |
| 9,340,897 B2 | 5/2016 | Schroeck |
| 2008/0153261 A1 | 6/2008 | Weber et al. |
| 2011/0253031 A1 | 10/2011 | Shonai |
| 2013/0014695 A1 | 1/2013 | Knerer et al. |
| 2014/0360425 A1* | 12/2014 | Schroeck ................ C30B 15/22 117/15 |

FOREIGN PATENT DOCUMENTS

| | | | |
|---|---|---|---|
| CN | 1844489 A | 10/2006 | |
| CN | 101591802 A | 12/2009 | |
| DE | 102013210687 A1 | 11/2014 | |
| EP | 0134680 A2 * | 3/1985 | ............. C30B 15/26 |
| EP | 0745830 A2 | 12/1996 | |
| EP | 0821082 A1 | 1/1998 | |
| JP | H7-109195 A | 4/1995 | |
| JP | 09118585 A | 5/1997 | |
| JP | 2007045684 A | 2/2007 | |
| JP | 2010150056 A | 7/2010 | |
| TW | 201447059 A | 12/2014 | |
| WO | 00/60145 A1 | 10/2000 | |
| WO | 01/29292 A1 | 4/2001 | |

* cited by examiner

METHOD FOR PULLING A SINGLE CRYSTAL COMPOSED OF SEMICONDUCTOR MATERIAL FROM A MELT CONTAINED IN A CRUCIBLE

CROSS REFERENCE TO RELATED APPLICATIONS

This application is the U.S. National Phase of PCT Appln. No. PCT/EP2017/074603 filed Sep. 28, 2017 which claims priority to German Application No. 10 2016 219 605.7 filed Oct. 10, 2016, the disclosures of which are incorporated in their entirety by reference herein.

BACKGROUND OF THE INVENTION

1. Field of the Invention

The invention relates to a method for pulling a single crystal composed of semiconductor material from a melt contained in a crucible, comprising pulling the single crystal in a phase in which an initial cone of the single crystal is grown until a phase in which the pulling of a cylindrical section of the single crystal is begun.

2. Description of the Related Art

The aim of the production of a single crystal composed of semiconductor material according to the Czochraiski method is usually to obtain a single crystal from which a maximum number of semiconductor wafers can be obtained. The shape of the single crystal comprises a comparatively short conical section or initial cone and a comparatively long cylindrical section. The semiconductor wafers are obtained from the cylindrical section. Accordingly, pulling the single crystal comprises a phase in which the initial cone is grown and a phase in which the cylindrical section is grown. Pulling a transition from the initial cone to the cylindrical section is called shouldering.

Closed-loop control of the diameter of the single crystal to a target diameter is not recommendable during the shouldering phase because the requisite measurement of the diameter of the single crystal is subject to disturbances. The diameter of the growing single crystal can only be initially measured directly as long as a bright ring is not visible at the meniscus. The term "meniscus" denotes that part of the melt which rises from the surface of the melt as far as the lower edge of the growing single crystal and which forms on account of surface tension and interfacial tension effects. Glowing hot parts of the relatively close surroundings of the single crystal, such as the crucible wall, for example, are reflected in the meniscus. The reflection of the crucible wall is perceived as a bright ring on a camera recording from the region of the phase boundary between growing single crystal and melt. The appearance of the bright ring shifts the bright/dark transition outward and thus makes it impossible to perform direct measurement of the diameter of the single crystal and closed-loop control of the diameter on the basis thereof.

WO 01/29292 A1 describes a method comprising predicting a diameter at which, when attained, shouldering is begun, specifically in such a way that when the predicted diameter is attained, the pulling rate is increased from a first to a second setpoint pulling rate. This method is not particularly flexible because shouldering cannot be begun at an arbitrary diameter, but rather only at the predicted diameter.

It is an object of the present invention to provide a method which does not have such a limitation.

SUMMARY OF THE INVENTION

The object of the invention is achieved by means of a method for pulling a single crystal composed of semiconductor material from a melt contained in a crucible, comprising pulling the single crystal in a phase in which an initial cone of the single crystal arises until a phase in which the pulling of d cylindrical section of the single crystal is begun, comprising measuring the diameter Dcr of the initial cone of the single crystal and calculating the change in the diameter dDcr/dt;
pulling the initial cone of the single crystal from the melt at a pulling rate vp(t) from a point in time t1 until a point in time t2, starting from which the pulling of the cylindrical section of the single crystal in conjunction with a target diameter Dcrs is begun, wherein the profile of the pulling rate vp(t) from the point in time VI until the point in time t2 during the pulling of the initial cone is predetermined by means of an iterative computation process.

DETAILED DISCUSSION OF THE PREFERRED EMBODIMENTS

Figure 1:
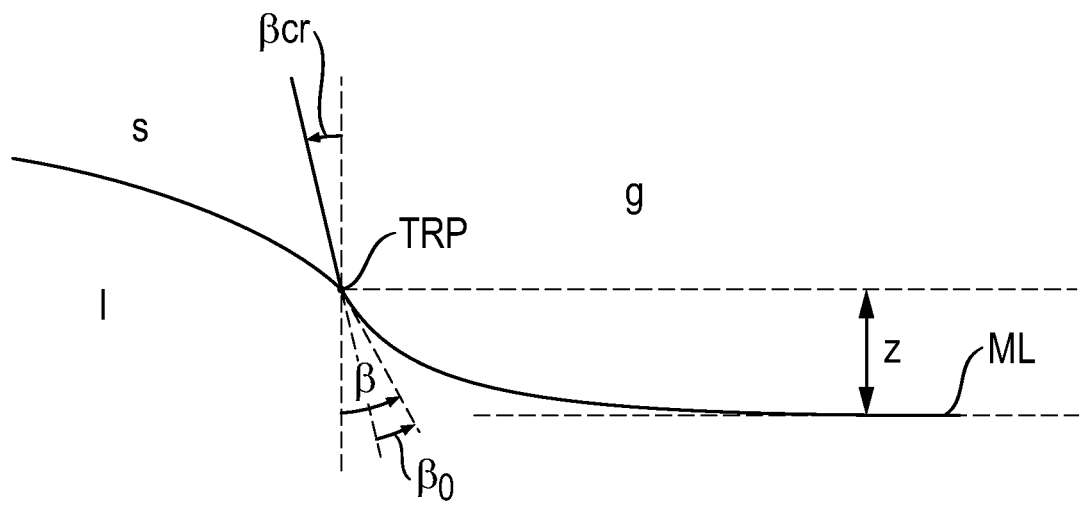
FIG. 1 schematically shows the environment of the phase boundary between the edge of the growing single crystal and the melt.

The method makes it possible to be able to begin shouldering at an arbitrary point in time t1 and to arrive at the target diameter by means of the open-loop control of the pulling rate. The target diameter is the diameter that the cylindrical section of the single crystal is intended to have.

In accordance with one preferred configuration of the invention, feeding heat to the growing single crystal also comprises feeding heat to the phase boundary between the edge of the single crystal and the melt by means of a ring-shaped heating device. The ring-shaped heating device is arranged above the melt. This feeding of heat is carried out at least in the time period from the point in time t1 until the point in time t2, preferably also at least during the pulling of the cylindrical section of the single crystal. For the time period from the point in time t1 until the point in time t2, the profile of the heating power LstR(t) of the ring-shaped heating device is predetermined, on the basis of which the growth rate of the single crystal vcr(t2) attains an envisaged value vcrs at the point in time t2.

Specifically, it is known that the concentration of point defects in the single crystal and the type of the dominant species of point defects crucially depend on the value of the quotient vcr/G, wherein G is the axial temperature gradient at the phase boundary between the single crystal and the melt. The axial temperature gradient G is substantially determined by the hot zone, which is taken to mean the relatively close surroundings of the growing single crystal, which influences the temperature field in its the single crystal and the melt. For a specific hot zone, the axial temperature gradient G can be approximately determined by simulation calculations.

The growth rate of the single crystal vcr(t2) at the point in time t2 is therefore preferably intended to assume a value that results in the quotient vcr(t2)/G having a desired setpoint value. In accordance with one particularly preferred configuration of the method, the desired setpoint value of the quotient lies in a range which has the consequence that point defects are formed in the single crystal only in concentrations that are comparatively low, and no agglomerates of point defects are formed or only those whose diameter is not more than 5 nm are formed. It is particularly preferred, moreover, to set the quotient in such a way that either vacancies or interstitials are dominant as point defect species over the entire radius of the single crystal.

By ensuring that the quotient vcr(t2)/G already has the setpoint value at the point in time t2, at which the pulling of the cylindrical section of the single crystal is begun, losses of yield are avoided which would arise if the value of the quotient had to be adapted to the setpoint value only after attaining the target diameter of the cylindrical section of the single crystal. The ring-shaped heating device can be embodied, for example, like one that is described in US 2013/0014695 A1, and can be arranged, for example, as shown in US 2008/0153261 A1.

The invention provides the sequence described below. Semiconductor material, preferably silicon, is melted in a crucible. The tip of a monocrystalline seed crystal is dipped into the melt, and the seed crystal is pulled away from the melt, wherein material of the melt adhering to the seed crystal crystallizes. Firstly, a neck-shaped section (neck) is pulled in order to eliminate dislocations.

Afterward, the diameter of the growing single crystal is extended, as a result of which the initial cone arises. During this phase until the point in time t1, at which shouldering is begun, the single crystal is preferably pulled in a manner comprising closed-loop control. The closed-loop control can be closed-loop controlled in relation to the diameter of the single crystal. Preference is given to using closed-loop control in relation to the crystal angle, that is to say closed-loop control in which the predefined reference variable is the crystal angle which is intended to be formed between the initial cone in the region of the phase boundary with respect to the melt and the its vertical. Such closed-loop control is described for example in WO 00/60145 A1.

Independently of the type of closed-loop control, the diameter Dcr of the initial cone is measured in the meantime. As long as a bright ring is not formed, the diameter can be measured directly by evaluation of a camera image showing the region of the phase boundary. If the bright ring is already visible, the diameter of the bright ring is measured and the diameter Dcr of the initial cone is calculated on the basis thereof. Such a procedure is described for example in EP0745830 A2. The relationship between the diameter Dcr and the diameter of the bright ring Dbr is expressed by equation (1), wherein $\Delta br(MenH(t))$ denotes the width of the bright ring, this width being dependent on the meniscus height MenH, which is in turn a function of time t:

$$Dbr = Dcr + 2 \cdot \Delta br(MenH(t)) \tag{1}$$

The measured diameter signal is expediently filtered before further processing, in order to suppress noise. The change in the diameter of the initial cone dDcr/dt is obtained by forming the time derivative of the diameter. The change in the diameter of the initial cone dDcr/dt forms the output variable for subsequently ascertaining the height MenH and the change in height dMenH/dt of the meniscus at the phase boundary.

Firstly, equation (2) establishes a relation to the crystal angle $\beta_{cr}$, wherein a prerequisite for the application of equation (2) is that the resulting crystal angle $\beta_{cr}$ has remained substantially unchanged at least in the relatively recent past:

$$\tan^{-1}((dDcr/dt)/2vcr) = \beta_{cr} \tag{2}$$

This prerequisite is usually fulfilled if, for the closed-loop control of pulling the initial cone, closed-loop control in relation to the crystal angle is used and a constant crystal angle is provided as reference variable.

The crystal angle $\beta_{cr}$ is less than the meniscus angle $\beta$, wherein 11° is generally assumed as a difference for silicon.

There are various approaches that relate the height of the meniscus to the meniscus angle $\beta$, for example the solution by Hurle as mentioned in WO 01/29292 A1 or the solution of the Laplace-Young equation (A. Sababskis et al., Crystal shape 2D modeling for transient CZ silicon crystal growth, Journal of Crystal Growth 377 (2013) 9-16). Using such a relation, it is possible to keep available an assignment table (look-up table) that assigns a height of the meniscus MenH, to the meniscus angle $\beta$. As a result, the current height of the meniscus MenH and its change dMenH/dt with respect to time can be ascertained with the aid of such an assignment table.

In accordance with equation (3), the pulling rate vp corresponds to the growth rate vcr of the single crystal, provided that the height of the meniscus does not change:

$$dMenH/dt = vp - vcr \tag{3}$$

If the meniscus height changes, this change has to be subtracted from the pulling rate vp in order to obtain the growth rate vcr. Under the abovementioned prerequisite that the crystal angle $\beta_{cr}$ has remained unchanged at least for some time, in this time period the meniscus height MenH has not changed either and the current growth rate vcr of the single crystal corresponds to the pulling rate vp.

The state of the initial cone at an arbitrary point in time t1 can then be specified with regard to its diameter, the meniscus height and the growth rate in this way: the diameter is Dcr(t1), the meniscus height is MenH(t1) and the growth rate is vcr(t1). With knowledge of the meniscus height MenH, knowledge about the magnitude of the difference $\Delta MenH = MenHs - MenH$ is also acquired, wherein the meniscus height MenHs denotes that meniscus height which is necessary for pulling the cylindrical section of the single crystal. When a meniscus height MenHs=7 mm is attained, the meniscus angle is $\beta = \beta_0 = 11°$, provided that the semiconductor material is silicon.

In order to arrive at the meniscus height MenHs, the pulling rate is increased at the point in time t1. The growth rate vcr changes with the meniscus height, wherein the change can be described in a general form by equation (4), wherein f(MenH(t)) is a function of the meniscus height MenH, which is in turn dependent on time t:

$$vcr(t) = vcr(t2) - f(MenH(t)) \tag{4}$$

A linear relationship in accordance with equation (5) can approximately be assumed, with a constant factor, which can be determined experimentally or by means of simulation:

$$vcr(t) = vcr(t2) - \text{factor} \cdot (MenHs - MenH(t)) \tag{5}$$

The growth rate vcr(t2) at the point in time t2 can be derived from the initial conditions, in a simplified manner for example according to equation (6) or in a more general form in accordance with equation (7), wherein f is a freely selectable function that maps the meniscus height onto a growth rate:

$$vcr(t2)=vp(t1)+\text{factor}*(\text{Men}Hs-\text{Men}H(t1)) \quad (6)$$

$$vcr(t2)=vp(t1)+f(\text{Men}H(t2))-f(\text{Men}H(t1)) \quad (7)$$

The growth rate vcr taken into consideration in this text is that component of the growth rate of the single crystal whose direction is directed oppositely to the direction of the pulling rate vp. According to the invention, the appropriate profile of the pulling rate vp(t) in the interval Δt=t2−t1 is predetermined by iterative numerical evaluation of equations (8) and (9):

$$\partial \text{Men}H/\partial t = vp(t)-vcr(t) \quad (8)$$

$$\partial Dcr/\partial t = vcr(t)*2 \tan \beta cr(t) \quad (9)$$

In this case, the acquired knowledge of the difference ΔMenH is utilized: if the meniscus height MenHs and thus the diameter Dcrs are attained at the point in time t2, ΔMenH corresponds to the area beneath the profile of the pulling rate vp(t) in the interval Δt=t2−t1 minus the area beneath the profile of the growth rate vcr(t) in the same interval.

Firstly, a planned profile of the pulling rate is predefined. This profile can be arbitrary in principle. By way of example, in a diagram in which vp(t)−vcr(t) is plotted against time t, in the interval Δt the profile has the shape of a rectangle, a triangle or a trapezoid. In a simple case, the shape is a rectangle. In a diagram in which the pulling rate vp(t) is plotted against time t, the rectangular shape of the area becomes a parallelogram. For this profile of the pulling rate vp(t), the area of the parallelogram corresponds to the change in the meniscus height ΔMenH which is necessary in order to arrive at the meniscus height MenHs, under the prerequisite that the length of the interval Δt, which is initially only assumed, is correct. In general, that will not be the case. The iterative computation process is carried out in order to determine the correct length of the interval. By solving equation (9), a check is made to ascertain whether the assumed length of the interval Δt is correct. That is the case if the target diameter Dcrs is attained at the point in time t2. If the target diameter Dcrs is not attained at the point in time t2, a longer interval Δt is assumed and the shape of the profile of the pulling rate vp(t) is correspondingly expanded, and the iterative computation process is repeated until the correct length for the interval Δt has been found. If the target diameter Dcrs is exceeded at the point in time t2, a shorter interval Δt is assumed and the shape of the profile of the pulling rate vp(t) is correspondingly compressed, and the iteration is repeated until the correct length for the interval Δt has been found. The iterative computation process is ended when the assumed length of the interval Δt leads to the target diameter Dcrs or to a diameter whose deviation from the target diameter is regarded as still acceptable. The assumed length of the interval Δt then corresponds to the correct length in these cases.

The state of the initial cone at the point in time t2 with regard to its diameter, the meniscus height and the growth rate can then be specified in this way: the diameter is Dcrs, the meniscus height is MenHs and the growth rate is vcr(t2).

The procedure described above makes it possible to be able to begin the shouldering at an arbitrary point in time t1 and to be able to complete this process in the interval Δt upon attaining the target diameter Dcrs, and subsequently to be able to continue pulling the single crystal by pulling the cylindrical section of the single crystal. Preferably, closed-loop control is used for pulling the cylindrical section of the single crystal.

Upon attaining the target diameter Dcrs at the point in time t2, the growth rate vcr(t2) is not necessarily identical to an envisaged growth rate vcrs. In accordance with the preferred embodiment of the method according to the invention, the growth rate of the single crystal vcr(t2) at the point in time t2 assumes a value that results in the quotient vcr(t2)/G having a desired setpoint value, or, to put it another way, the quotient at the point in time t2 has the value vcrs/G.

In order to achieve this, during the interval Δt the growth rate vcr(t) is altered in a planned manner by virtue of the fact that, by open-loop control of the heating power LstR(t) of a ring-shaped heating device arranged above the melt, heat is fed to the phase boundary between the edge of the single crystal and the melt. For the time period from the point in time t1 until the point in time t2, that profile of the heating power LstR(t) of the ring-shaped heating device is predetermined which has the effect that, owing to the feeding of heat to the phase boundary, the growth rate of the single crystal vcr(t2) at the point in time t2 has the envisaged value vcrs. The ring-shaped heating device is preferably arranged concentrically with respect to the circumference of the initial cone above the melt.

In order to find the suitable profile of the heating power LstR(t) in the interval Δt, a relationship with the profile of the growth rate vcr(t) in the interval Δt is assumed, which relationship can be linear or nonlinear and can be found experimentally or by simulation. For the sake of simplicity, a linear relationship is assumed, for example, which is represented by equation (10).

$$\Delta vcr(t) = \text{const}*\Delta LstR(t) \quad (10)$$

The constant const can be determined for example experimentally or by means of simulation. In order to alter the growth rate vcr(t1) at the point in time t1 within the interval Δt to the growth rate vcrs at the point in time t2, a change in the heating power is thus required, which is proportional to the envisaged change in the growth rate Δvcr=vcrs−vcr(t1) and can be brought about on the basis of knowledge of Δvcr.

Predetermining the profile of the pulling rate vp(t) in the interval Δt takes place as already described, with the difference that the iterative computation process takes as a basis a profile of the growth rate vcr(t), in the interval Δt for which the growth rate at the point in time t2 is the growth rate vcrs. At the end of the iterative computation process, for the interval Δt the profile of the pulling rate vp(t) and the profile of the growth rate vcr(t) and, owing to the abovementioned relationship, also the profile of the heating power LstR(t) are then fixed and pulling rate vp(t) and heating power LstR(t) are changed under open-loop control in a manner corresponding to the respective profile from the point in time t1 onward.

The state of the initial cone at the point in time t2 with regard to its diameter, the meniscus height and the growth rate can then be specified in this way: the diameter is Dcrs, the meniscus height is MenHs and the growth rate is vcrs.

Predetermining the profile of the pulling rate vp(t) in the interval Δt or predetermining the profile of the pulling rate vp(t) in the interval Δt and the profile of the heating power LstR(t) in the interval Δt preferably takes place in a PLC unit (programmable logic controller) of the pulling installation, thereby ensuring that the iterative computation process proceeds rapidly enough and is ended at the point in time t1 or negligibly later.

The invention is explained in more detail below with reference to drawings.

LIST OF REFERENCE SIGNS USED IN THE DRAWINGS

TRP Phase boundary between the edge of the single crystal and the melt
ML Surface of the melt
MenH Meniscus height
MenHs Meniscus height during the growth of the cylindrical section
s Solid phase, initial cone
l Liquid phase
g Gaseous phase
$\beta_0$ Difference between $\beta$ and $\beta cr$
$\beta$ Meniscus angle during the growth of the initial cone
$\beta cr$ Crystal angle
vp Pulling rate
vcr Growth rate
vcrs Envisaged growth rate FIG. 1 schematically shows the environment of the phase boundary between the edge of the growing single crystal and the melt. The illustration shows the phase boundary TRP (triple point) between solid, liquid and gaseous phases (s, l, g), wherein the solid m phase s is formed by the initial cone and the liquid phase l is formed by the melt. Toward the edge of the single crystal, the melt is elevated to form a meniscus that rises from the surface ML of the melt above the meniscus height MenH.

Figure 2:
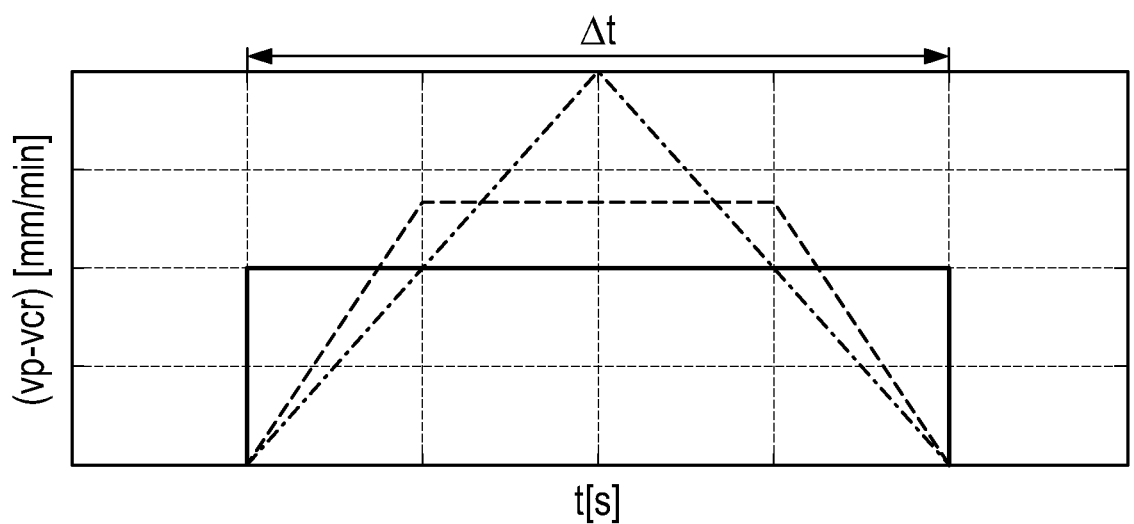
FIG. 2 is a diagram in which the difference (vp−vcr) is plotted against time t.

FIG. 2 shows a diagram in which the difference (vp−vcr) between pulling rate vp and growth rate vcr is plotted against time t in a time interval $\Delta t$. On the basis of three examples it can be seen how the planned profile of vp in the interval $\Delta t$ can be chosen, namely such that the profile in the illustration is rectangular, triangular and trapezoidal, respectively.

Figure 3:
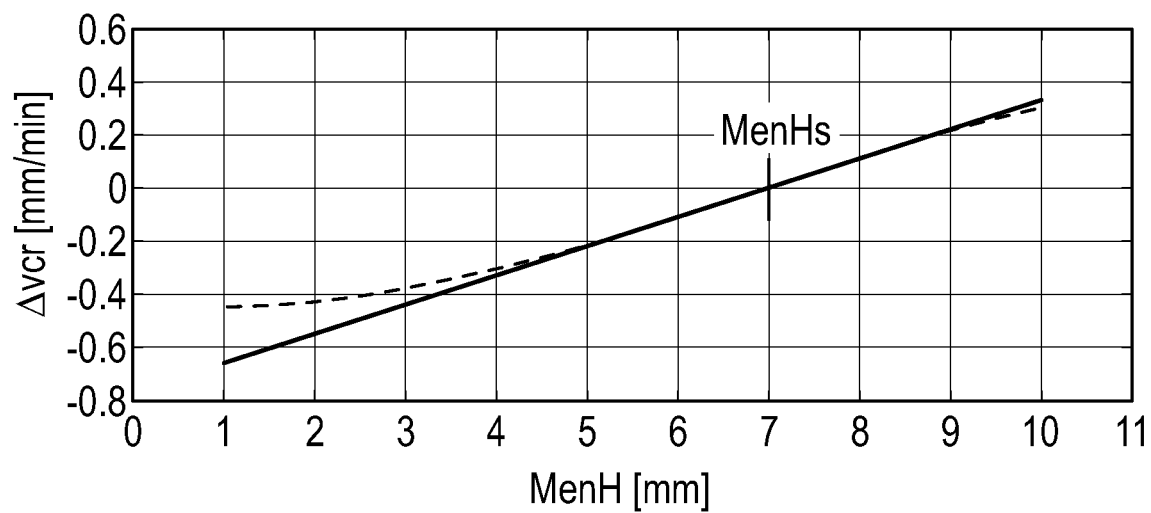
FIG. 3 is a diagram in which the difference Δvcr is plotted against the meniscus height MenH.

FIG. 3 is a diagram in which the difference $\Delta vcr$ is plotted against the meniscus height MenH. The solid line describes a linear relationship that can approximately be assumed; the dashed curve describes a nonlinear relationship that is considered as an alternative, particularly if the difference $\Delta vcr$ is comparatively large.

Figure 4:
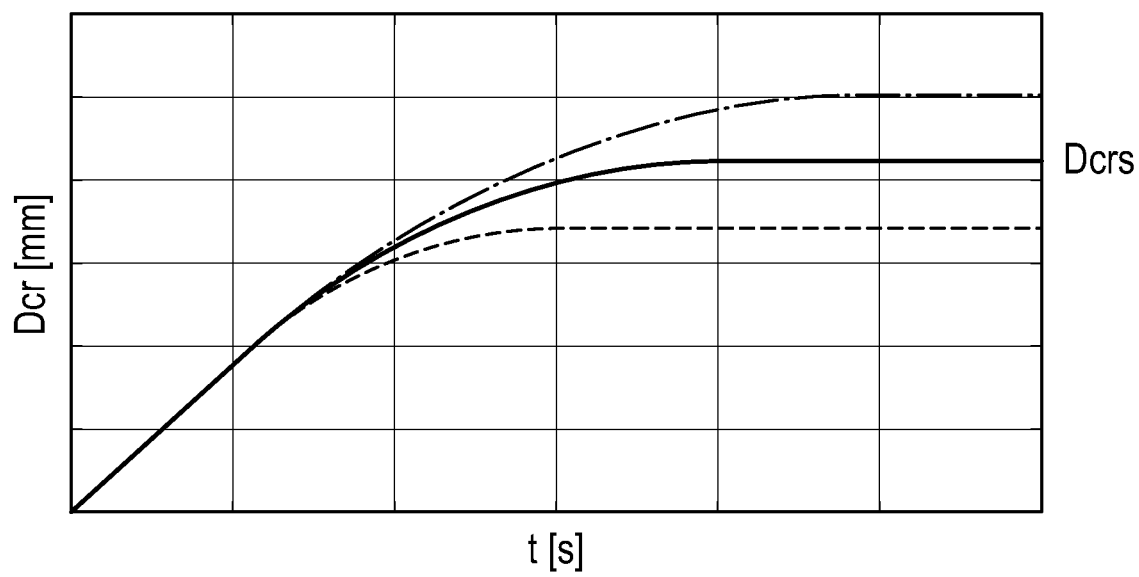
FIG. 4 is a diagram in which the diameter Dcr of the growing single crystal is plotted against time t.

FIG. 4 is a diagram in which the diameter Dcr of the growing single crystal is plotted against time t. In the iterative computation process, a check is made to ascertain whether, in the case of the assumed profile of the pulling rate vp and the growth rate vcr in the assumed interval $\Delta t$, the diameter of the single crystal attains the target diameter Dcrs at the end of the interval. Typically, the check firstly yields a final diameter corresponding to the dashed curves which is greater or less than the target diameter Dcr. While maintaining the shape of the assumed profile of pulling rate vp and growth rate vcr, the length of the interval is correspondingly altered and the iterative computation process is continued until the check yields a diameter development corresponding to the solid curve, as a result of which the target diameter Dcrs is attained at the end of the interval $\Delta t$.

Figure 5:
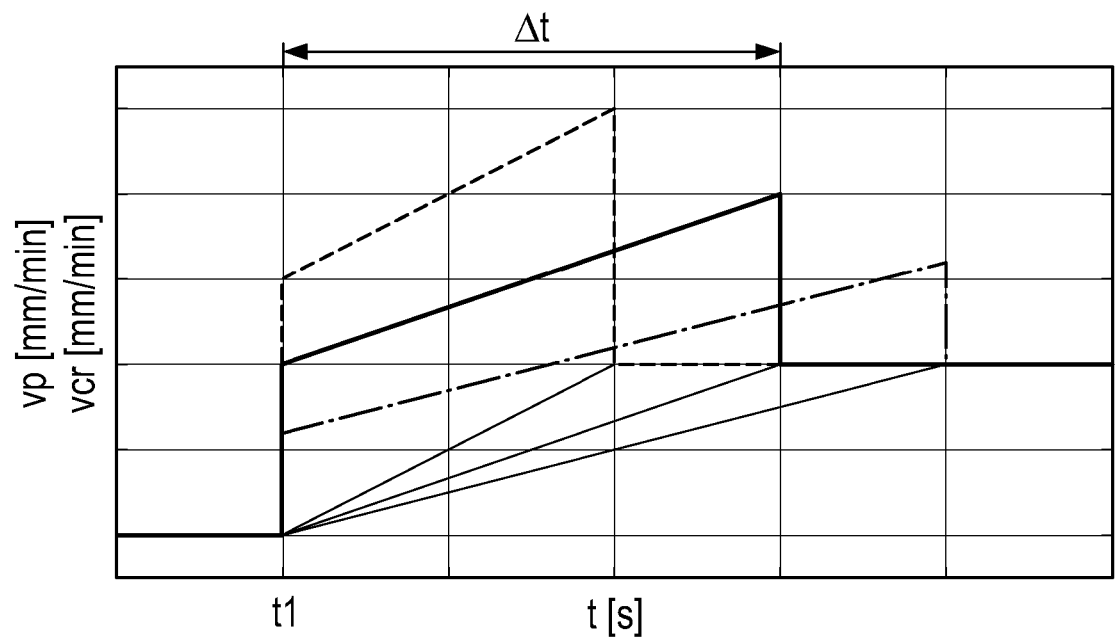
FIG. 5 and FIG. 6 are diagrams in which the pulling rate vp and the growth rate vcr, respectively, are plotted against time t.

FIG. 5 is a diagram in which the pulling rate vp and the growth rate vcr are plotted against time. Three different profile pairs in each case are illustrated, two with a profile of the pulling rate vp symbolized by dashed lines, and one profile pair in which a solid line symbolizes the profile of the pulling rate vp. The areas between the respective profile pairs are of identical magnitude and represent the same difference $\Delta MenH$ regarding the meniscus height which has to be overcome in order, from the point in time t1 onward, to obtain the meniscus height MenHs that is necessary for pulling the cylindrical section of the single crystal. Proceeding from a profile pair having dashed profiles of the pulling rate vp, the iterative computation process leads to the result that the target diameter Dcr is attained if that profile pair is realized in which the solid line symbolizes the profile of the pulling rate vp. It is only in the case of this profile pair that the interval $\Delta t$ has the correct length.

Figure 6:
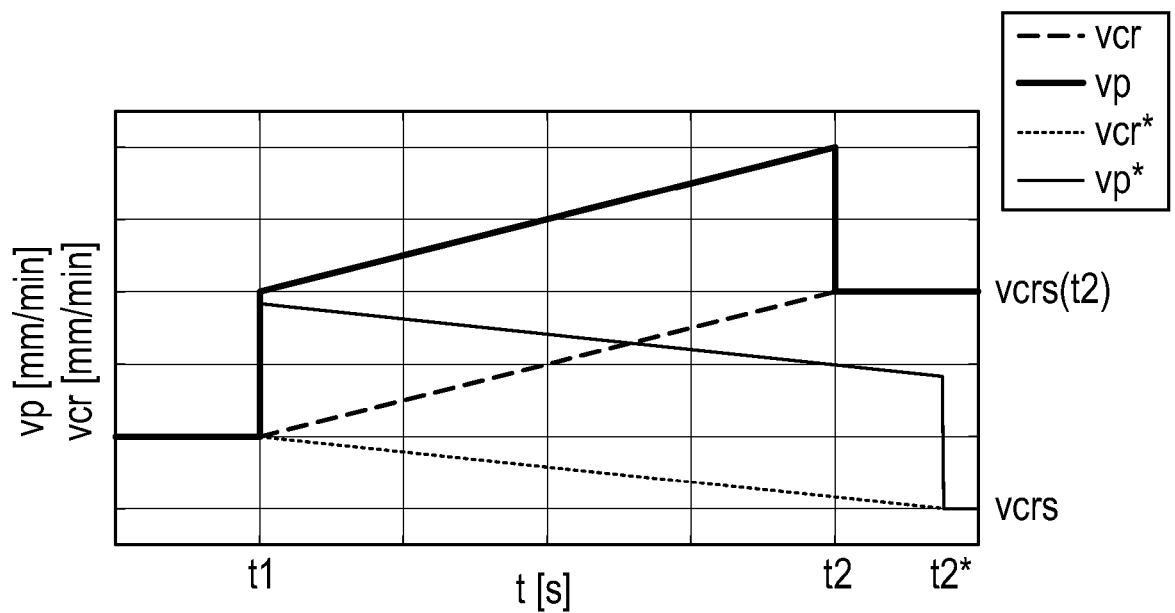

FIG. 6 is a diagram in which the pulling rate vp and the growth rate vcr are plotted against time. The illustration shows a typical profile of the pulling rate vp and of the growth rate vcr in an interval $\Delta t = t2-t1$ and a typical profile of the pulling rate vp* and of the growth rate vcr* in an interval $\Delta t = t2-t1$ which have the effect that at the end of the interval the diameter of the single crystal attains the target diameter Dcrs. The profiles of vp, vcr and $\Delta t = t2-t1$ are the result of the iterative computation process which does not provide a planned alteration of the growth rate by open-loop control of the heating power LstR(t) of a ring-shaped heating device toward an envisaged growth rate vcrs. The profiles of vp*, vcr* and $\Delta t = t2*-t1$ are the result of the iterative computation process which provides a planned alteration of the growth rate by open-loop control of the heating power LstR(t) of a ring-shaped heating device toward an envisaged growth rate vcrs.

The invention claimed is:

1. A method for pulling a single crystal composed of semiconductor material having a constant diameter portion with a target diameter Dcrs from a melt contained in a crucible, comprising
    pulling the single crystal in a phase in which an initial cone of the single crystal is grown until a phase in which the pulling of a cylindrical section of the single crystal is begun, by:
    measuring a diameter Dcr of the initial cone of the single crystal and calculating a change in the diameter dDcr/dt;
    pulling the initial cone of the single crystal from the melt at a pulling rate vp(t) from a point in time t1 until a point in time t2, wherein following t2 the pulling of the cylindrical section of the single crystal in conjunction with the target diameter Dcrs begins, wherein a profile of the pulling rate vp(t) from the point in time t1 until the point in time t2 is predetermined, and a difference $\Delta t = t2-t1$ is changed during the pulling of the initial cone by iteratively evaluating equations $$\partial MenH/\partial t = vp(t) - vcr(t)$$

$$\partial Dcr/\partial t = vcr(t) * 2 \tan \beta cr(t)$$

until the point in time t2 matches an attainment of the target diameter Dcrs, wherein MenH, vcr and $\beta cr$ denote a meniscus height, a growth rate of the single crystal and a crystal angle, respectively.

2. The method of claim 1, further comprising:
    feeding heat to a phase boundary between an edge of the single crystal and the melt by open-loop control of a heating power LstR(t) of a ring-shaped heating device arranged above the melt, and
    predetermining a profile of the heating power LstR(t) of the ring-shaped heating device from the point in time t1 until the point in time t2 by iteratively evaluating the equations such that the growth rate of the single crystal at the point in time t2 has a target value vcrs.

* * * * *